(12) United States Patent
Sugar et al.

(10) Patent No.: US 7,565,117 B2
(45) Date of Patent: *Jul. 21, 2009

(54) CONTROL OF POWER AMPLIFIERS IN DEVICES USING TRANSMIT BEAMFORMING

(75) Inventors: Gary L. Sugar, Rockville, MD (US); Chandra Vaidyanathan, Bethesda, MD (US); Sifen Lou, Potomac, MD (US)

(73) Assignee: IPR Licensing, Inc., Wilmington, DE (US)

( * ) Notice: Subject to any disclaimer, the term of this patent is extended or adjusted under 35 U.S.C. 154(b) by 489 days.

This patent is subject to a terminal disclaimer.

(21) Appl. No.: 11/326,630

(22) Filed: Jan. 6, 2006

(65) Prior Publication Data

US 2006/0116087 A1 Jun. 1, 2006

Related U.S. Application Data

(63) Continuation of application No. 10/867,249, filed on Jun. 14, 2004, now Pat. No. 6,993,299, which is a continuation of application No. 10/249,063, filed on Mar. 13, 2003, now Pat. No. 6,871,049.

(60) Provisional application No. 60/365,811, filed on Mar. 21, 2002, provisional application No. 60/365,775, filed on Mar. 21, 2002, provisional application No. 60/365,797, filed on Mar. 21, 2002.

(51) Int. Cl.
 *H04B 1/04* (2006.01)

(52) U.S. Cl. ..................... 455/103

(58) Field of Classification Search .......... 455/101, 455/103, 105, 127.1, 127.2, 522, 550.1, 561, 455/562.1
See application file for complete search history.

(56) References Cited

U.S. PATENT DOCUMENTS

| 4,121,221 A | 10/1978 | Meadows |
| 4,599,734 A | 7/1986 | Yamamoto |
| 4,639,914 A | 1/1987 | Winters |
| 4,811,420 A | 3/1989 | Avis et al. |

(Continued)

FOREIGN PATENT DOCUMENTS

WO 01/45300 6/2001

(Continued)

OTHER PUBLICATIONS

Iserte et al., "Pre-and Post-Beamforming in MIMO Channels Applied to HIPERLAN/2 and OFDM", IST Summit 2001, IST Mobile Communications Summit, Sep. 2001.

(Continued)

*Primary Examiner*—Thanh C Le
(74) *Attorney, Agent, or Firm*—Volpe and Koenig, PC

(57) ABSTRACT

A transmitter comprises a plurality of transmit antennas for simultaneously transmitting weighted signals according to a channel transfer function. Each antenna has a corresponding amplifier that is bias controlled according to the transmit weights derived for the antenna transmission. A baseband processor produces digital weighted signals for upconversion and amplification by the amplifiers. Each amplifier is accompanied by a bias circuit responsive to the transmit weights. Alternatively, or additionally, corresponding DC/DC converters are used to control the operating voltage of the amplifiers.

14 Claims, 8 Drawing Sheets

U.S. PATENT DOCUMENTS

| | | | |
|---|---|---|---|
| 5,274,844 A | 12/1993 | Harrison et al. |
| 5,394,435 A | 2/1995 | Weerackody |
| 5,437,055 A | 7/1995 | Wheatley, III |
| 5,457,808 A | 10/1995 | Osawa et al. |
| 5,491,723 A | 2/1996 | Diepstraten |
| 5,493,307 A | 2/1996 | Tsujimoto |
| 5,493,722 A | 2/1996 | Gunn et al. |
| 5,507,035 A | 4/1996 | Bantz et al. |
| 5,539,832 A | 7/1996 | Weinstein et al. |
| 5,570,366 A | 10/1996 | Baker et al. |
| 5,577,265 A | 11/1996 | Wheatley, III |
| 5,610,617 A | 3/1997 | Gans et al. |
| 5,621,732 A | 4/1997 | Osawa |
| 5,752,173 A | 5/1998 | Tsujimoto |
| 5,761,193 A | 6/1998 | Derango et al. |
| 5,761,237 A | 6/1998 | Petersen et al. |
| 5,771,462 A | 6/1998 | Olsen |
| 5,812,531 A | 9/1998 | Cheung et al. |
| 5,848,105 A | 12/1998 | Gardner et al. |
| 5,854,611 A | 12/1998 | Gans et al. |
| 5,898,679 A | 4/1999 | Brederveld et al. |
| 5,912,921 A | 6/1999 | Warren et al. |
| 5,924,020 A | 7/1999 | Forssen et al. |
| 5,930,248 A | 7/1999 | Langlet et al. |
| 5,982,327 A | 11/1999 | Vook et al. |
| 6,008,760 A | 12/1999 | Shattil |
| 6,018,642 A | 1/2000 | Adachi |
| 6,023,625 A | 2/2000 | Myers, Jr. |
| 6,037,898 A | 3/2000 | Parish et al. |
| 6,038,272 A | 3/2000 | Golden |
| 6,044,120 A | 3/2000 | Bar-David et al. |
| 6,058,105 A | 5/2000 | Hochwald et al. |
| 6,064,338 A | 5/2000 | Kobayakawa et al. |
| 6,091,934 A | 7/2000 | Berman et al. |
| 6,097,771 A | 8/2000 | Foschini |
| 6,118,788 A | 9/2000 | Kermani et al. |
| 6,122,260 A | 9/2000 | Liu et al. |
| 6,124,824 A | 9/2000 | Xu et al. |
| 6,141,393 A | 10/2000 | Thomas et al. |
| 6,141,567 A | 10/2000 | Youssefmir et al. |
| 6,144,651 A | 11/2000 | Rinchiuso et al. |
| 6,144,711 A | 11/2000 | Raleigh et al. |
| 6,147,985 A | 11/2000 | Bar-David et al. |
| 6,157,340 A | 12/2000 | Xu et al. |
| 6,157,843 A | 12/2000 | Derango et al. |
| 6,177,906 B1 | 1/2001 | Petrus |
| 6,185,440 B1 | 2/2001 | Barratt et al. |
| 6,195,045 B1 | 2/2001 | Xu et al. |
| 6,211,671 B1 | 4/2001 | Shattil |
| 6,218,986 B1 | 4/2001 | Yukitomo et al. |
| 6,252,548 B1 | 6/2001 | Jeon |
| 6,252,884 B1 | 6/2001 | Hunter |
| 6,266,528 B1 | 7/2001 | Farzaneh |
| 6,295,026 B1 | 9/2001 | Chen et al. |
| 6,298,092 B1 | 10/2001 | Heath, Jr. |
| 6,307,882 B1 | 10/2001 | Marzetta |
| 6,317,466 B1 | 11/2001 | Foschini et al. |
| 6,327,310 B1 | 12/2001 | Hochwald et al. |
| 6,331,837 B1 | 12/2001 | Shattil |
| 6,349,219 B1 | 2/2002 | Hochwald et al. |
| 6,351,499 B1 | 2/2002 | Paulraj et al. |
| 6,362,781 B1 | 3/2002 | Thomas et al. |
| 6,369,758 B1 | 4/2002 | Zhang |
| 6,370,182 B2 | 4/2002 | Bierly et al. |
| 6,377,631 B1 | 4/2002 | Raleigh |
| 6,377,636 B1 | 4/2002 | Paulraj et al. |
| 6,377,819 B1 | 4/2002 | Gesbert et al. |
| 6,400,699 B1 | 6/2002 | Airy et al. |
| 6,400,780 B1 | 6/2002 | Rashid-Farrokhi et al. |
| 6,442,214 B1 | 8/2002 | Boleskei et al. |
| 6,459,786 B1 | 10/2002 | Bergstrom |
| 6,462,709 B1 | 10/2002 | Choi |
| 6,463,295 B1 | 10/2002 | Yun |
| 6,473,467 B1 | 10/2002 | Wallace et al. |
| 6,522,898 B1 | 2/2003 | Kohno et al. |
| 6,549,786 B2 | 4/2003 | Cheung |
| 6,570,929 B1 | 5/2003 | Eriksson |
| 6,584,161 B2 | 6/2003 | Hottinen |
| 6,625,162 B2 | 9/2003 | Myojo et al. |
| 6,636,568 B2 | 10/2003 | Kadous |
| 6,646,600 B2 | 11/2003 | Vail et al. |
| 6,684,064 B2 | 1/2004 | Kazakevich et al. |
| 6,687,492 B1 | 2/2004 | Sugar et al. |
| 6,728,294 B1 | 4/2004 | Kohno et al. |
| 6,728,517 B2 | 4/2004 | Sugar et al. |
| 6,792,033 B1 | 9/2004 | Maruta et al. |
| 6,862,271 B2 * | 3/2005 | Medvedev et al. .......... 370/329 |
| 6,873,606 B2 | 3/2005 | Agrawal et al. |
| 6,873,651 B2 | 3/2005 | Tesfai et al. |
| 6,888,878 B2 | 5/2005 | Prysby et al. |
| 6,895,255 B1 | 5/2005 | Bridgelall |
| 6,901,122 B2 | 5/2005 | Nadgauda et al. |
| 6,904,021 B2 | 6/2005 | Belcea |
| 6,940,917 B2 | 9/2005 | Menon et al. |
| 6,956,907 B2 | 10/2005 | Ketchum |
| 6,961,545 B2 | 11/2005 | Tehrani et al. |
| 6,970,682 B2 | 11/2005 | Crilly, Jr. et al. |
| 6,980,600 B1 | 12/2005 | Ratnarajah |
| 6,983,167 B2 | 1/2006 | Adachi et al. |
| 7,031,368 B1 | 4/2006 | Maruta et al. |
| 7,042,860 B2 | 5/2006 | Kasami et al. |
| 7,230,940 B2 | 6/2007 | Fantaske |
| 7,277,409 B1 | 10/2007 | Thermond et al. |
| 7,340,279 B2 | 3/2008 | Chen et al. |
| 7,342,875 B2 | 3/2008 | Hammons, Jr. et al. |
| 2001/0012764 A1 | 8/2001 | Edwards et al. |
| 2001/0015994 A1 | 8/2001 | Nam |
| 2001/0046255 A1 | 11/2001 | Shattil |
| 2001/0053143 A1 | 12/2001 | Li et al. |
| 2001/0053699 A1 | 12/2001 | McCrady et al. |
| 2002/0001316 A1 | 1/2002 | Hornsby et al. |
| 2002/0024975 A1 | 2/2002 | Hendler |
| 2002/0034191 A1 | 3/2002 | Shattil |
| 2002/0039884 A1 | 4/2002 | Raynes et al. |
| 2002/0045435 A1 | 4/2002 | Fantaske |
| 2002/0051430 A1 | 5/2002 | Kasami et al. |
| 2002/0064246 A1 | 5/2002 | Kelkar et al. |
| 2002/0067309 A1 | 6/2002 | Baker et al. |
| 2002/0072392 A1 | 6/2002 | Awater et al. |
| 2002/0085643 A1 | 7/2002 | Kitchener et al. |
| 2002/0102950 A1 | 8/2002 | Gore et al. |
| 2002/0111142 A1 | 8/2002 | Klimovitch |
| 2002/0118781 A1 | 8/2002 | Thomas et al. |
| 2002/0122383 A1 | 9/2002 | Wu et al. |
| 2002/0122501 A1 | 9/2002 | Awater et al. |
| 2002/0127978 A1 | 9/2002 | Khatri |
| 2002/0136170 A1 | 9/2002 | Struhsaker |
| 2002/0141355 A1 | 10/2002 | Struhsaker et al. |
| 2002/0147032 A1 | 10/2002 | Yoon et al. |
| 2002/0158801 A1 | 10/2002 | Crilly, Jr. et al. |
| 2002/0159537 A1 | 10/2002 | Crilly, Jr. |
| 2002/0172186 A1 | 11/2002 | Larsson |
| 2002/0172269 A1 | 11/2002 | Xu |
| 2002/0196842 A1 | 12/2002 | Onggosanusi et al. |
| 2003/0002450 A1 | 1/2003 | Jalali et al. |
| 2003/0022693 A1 | 1/2003 | Gerogiokas et al. |
| 2003/0032423 A1 | 2/2003 | Boros et al. |
| 2003/0048761 A1 | 3/2003 | Jarett |
| 2003/0108117 A1 | 6/2003 | Ketchum et al. |
| 2003/0114108 A1 | 6/2003 | Frecassetti et al. |
| 2003/0125090 A1 | 7/2003 | Zeira |
| 2003/0139194 A1 | 7/2003 | Onggosanusi et al. |
| 2003/0157954 A1 | 8/2003 | Medvedev et al. |
| 2003/0181165 A1 | 9/2003 | Sugar et al. |

| | | | |
|---|---|---|---|
| 2004/0072546 A1 | 4/2004 | Sugar et al. | |
| 2004/0104839 A1 | 6/2004 | Velazquez et al. | |
| 2005/0192048 A1 | 9/2005 | Bridgelall | |
| 2007/0117513 A1 | 5/2007 | Kasami et al. | |

FOREIGN PATENT DOCUMENTS

WO 02/03568 1/2002

OTHER PUBLICATIONS

Iserte et al., "Joint Beamforming Strategies in OFDM-MIMO Systems", ICASSP 2002, IEEE International Conference on Acoustics, Speech and Signal Processing, May 2002.

Lee et al., "Antenna Diversity for an OFDM System in a Fading Channel", Proceeding of IEEE MILCOM 1999, Nov. 1999, pp. 1104-1109.

Jakes, "Microwave Mobile Communications", Copyright 1974, pp. 313-320 and pp. 489-498.

Briesemeister et al., "Role-Based Multicast in Highly Mobile but Sparsely Connect Ad-Hoc Networks"; First Annual Workshop on Mobile Ad Hoc Networking & Computing; pp. 45-50; Aug. 2000.

Bablan et al., "Optimum Diversity Combining and Equalization in Digital Data Transmission with Applications to Cellular Mobile Radio-Part II: Numerical Results"; May 1992; IEEE Transactions on Communications, vol. 30, No. 5; pp. 895-907.

Brunner et al., "Downlink Beamforming for WCDMA Based on Uplink Channel Parameters"; Proceedings of $3^{rd}$ European Personal Mobile Conference (EPMCC'99), Mar. 1999, pp. 334-339.

Yeh, "An analysis of Adaptive Retransmission Arrays in a Fading Environment", The Bell System Technical Journal, Oct. 1970, pp. 1811-1825.

Morgan, "Interaction of Adaptive Antenna Arrays in an Arbitrary Environment", The Bell System Technical Journal, Jan. 1965, pp. 23-47.

Stridh et al., "MIMO Channel Capacity on a Measured Indoor Radio Channel at 5.8 GHz", Proc. of the Asilomar Conf. on Signals, Systems & Computers, vol. 1, Oct. 2000, pp. 733-737.

Aziz et al., "Indoor Throughput and Range Improvements Using Standard Complaint AP Antenna Diversity in IEEE 802.11a and ETSI HIPERLAN/2", Vehicular Technology Conference, 2002, VTC 2001, Oct. 7-11, 2001, IEEE VTS $54^{th}$, vol. 4, pp. 2294-2298.

Iserte et al., "Iterative Algorithm for the Estimation of Distributed Sources Localization Parameters", SSP 2001, $11^{th}$ IEEE Workshop on Statistical Signal Processing, Aug. 2001.

Vaidyanathan et al., "The Role In Lossless Systems in Modern Digital Signal Processing: A Tutorial", IEEE Transactions on Education, vol. 32, Aug. 1989, pp. 181-197.

Raleigh et al., "Spatio-Temporal Coding for Wireless Communication", IEEE Transactions on Communications, vol. 46, No. 3, Mar. 1998, pp. 357-366.

Jungnickel et al., "Performance of a MIMO System with Overlay Pilots", IEEE GlobeCom 2001, pp. 594-598.

"Blast High-Level Overview", Lucent Technologies, Jul. 18, 2000.

Golden et al., "Detection Algorithm and Initial Laboratory Results Using V-Blast Space-Time Communication Architecture", Electronic Letters, Jan. 7, 1999, vol. 35, No. 1.

Golden et al., "V-Blast: A High Capacity Space-Time Architecture for the Rich-Scattering Wireless Channel", Bell Laboratories, Lucent Technologies, Proc. Int'l Symposium on Advanced Radio Technologies, Boulder, CO, Sep. 10, 1998.

Chizhik et al., "Keyholes, Correlations, and Capacities of Multielement Transmit and Receiver Antennas", IEEE Transactions on Wireless Communications, vol., 1, No. 2, Apr. 2002, pp. 361-368.

Junqiang et al., "Spatial Multiuser Access with MIMO Smart Antennas for OFDM Systems", IEEE VTC 2001, Sep. 2001, pp. 1553-1557.

Jungnickel et al., "A MIMO WLAN Based on Linear Channel Inversion", IEE Seminar-MIMO Communication Systems from Concept TO Implementation, Dec. 2001, pp. 20/1-20/6.

Stridh et al., "Spatial Characterization of Indoor Radio Channel Measurements at 5GHz", SAM 2000, Mar. 2000, pp. 58-62.

Irmer et al., "MISO Concepts for Frequency-Selective Channels", 2002 International Zurich Seminar on Broadband Communications Access, Feb. 19-21, 2002.

Choi et al., "MISO CDMA Transmission with Simplified Receiver for Wireless Communication Handsets", IEEE Transactions on Communications, vol. 49, No. 5, May 2002.

Meyer-Ottens, et al. "Downlink Beamforming for W-CDMA Using Feedback and Interference Estimate", Mar. 9, 2001.

Yang et al., "On Joint Transmitter and Receive Optimization for Multiple-Input-Multiple-Output (MIMO) Transmission Systems", IEEE Transactions on Communications, vol. 42, No. 12, Dec. 1994.

Ivrlac et al., "On Channel Capacity of Correlated MIMO Channels", ITG Fokusprojekt: Mobilkommunikation "Systeme mit Intelligenten Antennen", Iimenau, 2001.

Chuah et al., "Capacity of Multi-Antenna Array Systems in Indoor Wireless Environment", Nov. 1998, IEEE Globecom.

Wallace et al., "Experimental Characterization of the MIMO Wireless Channel: Data Acquisition and Analysis", Feb. 27, 2002, Department of Electrical and Computer Engineering, Brigham Young University.

Love et al., "Equal Gain Transmission in Multiple-Input Multiple-Output Wireless Systems", Nov. 2002, Proceedings of IEEE Globecom, pp. 1124-1128.

Lucent Technologies, "Lucent Technologies: Chips Poised to Bring 'Blast' Multiple Input/Multiple Output Technology to Laptops, PDAs and Other Mobile Devices,", Oct. 16, 2002, lucent.com.

"Lucent's 'Blast'Chips to Take Off in Wireless Market", EETimes.com, Oct. 16, 2002.

Health et al., "A Simple Scheme for Transmit Diversity Using Partial Channel Feedback", Signals, Systems & Computers, Conference Record of the Thirty-Second Asilomar Conference, Nov. 1-4, 1998; vol. 2; pp. 1073-1078.

Chiu et al., "OFDM Receiver Design", EE225C, Fall 2000, University of California, Berkeley.

Wolniansky et al., "V-Blast: An Architecture for Realizing Very High Data Rates Over the Rich-Scattering Wireless Channel", Proc. ISSSE-98, Pisa, Italy, Sep. 29, 1998.

Sanchez et al., "CSMA/CA Beam Forming Antennas in Multi-hop Packet Radio"; Proc. For Swedish Workshop on Wireless Ad-Hoc Networks, Mar. 5-6, 2001.

Golden et al., "V-Blast: A High Capacity Space-Time Architecture for the Rich-Scattering Wireless Channel", Bell Laboratories, Lucent Technologies, Proc. Int'l Symposium on Advanced Radio Technologies, Boulder, CO, Sep. 10, 1998.

Golub et al., Matrix Computation, "7.3 Power Iterations", The Johns Hopkins University Press, Second Edition, pp. 351, (1983).

Heath et al., "A Simple Scheme for Transmit Diversity Using Partial Channel Feedbank", Signals, Systems & Computers, Conference Record of the Thirty-Second Asilomar Conference, Nov. 1-4, 1998; vol. 2; pp. 1073-1078.

Irmer et al., "MISO Concepts for Frequency-Selective Channels", 2002 International Zurich Seminar on Broadband Communications Access, Feb. 19-21, 2002.

Iserte et al., "Iterative Algorithm for the Estimation of Distributed Sources Localization Parameters", SSP 2001, $11^{th}$ IEEE Workshop on Statistical Signal Processing, Aug. 2001.

Iserte et al., "Joint Beamforming Strategies in OFDM-MIMO Systems", ICASSP 2002, IEEE International Conference on Acoustics, Speech and Signal Processing, May 2002.

Iserte et al., "Pre-and Post-Beamforming in MIMO Channels Applied to HIPERLAN/2 and OFDM", IST Summit 2001, IST Mobile Communications Summit, Sep. 2001.

Ivrlac et al., "On Channel Capacity of Correlated MIMO Channels", ITG Fokusprojekt: Mobilkommunikation "Systeme mit Intelligenten Antennen", Iimenau, 2001.

Jakes, "Microwave Mobile Communications", Copyright 1974, pp. 313-320 and pp. 489-498.

Jungnickel et al., "A MIMO WLAN Based on Linear Channel Inversion", IEE Seminar-MIMO Communication Systems from Concept TO Implementation, Dec. 2001, pp. 20/1-20/6.

Jungnickel et al., "Performance of a MIMO System with Overlay Pilots", IEEE GlobeCom 2001, pp. 594-598.

Junqiang et al., "Spatial Multiuser Access with MIMO Smart Antennas for OFDM Systems", IEEE VTC 2001, Sep. 2001, pp. 1553-1557.

Lan Man Standards Committee Of The IEEE Computer Society, "Information Technology - Telecommunications And Information Exchange Between Systems - Local And Metropolitan Area Networks - Specific Requirements - Part 11: Wireless LAN Medium Access Control (MAC) And Physical Layer (PHY) Specifications", ANSI/IEEE Std 802.11, 1999 Edition (R2003), (Reaffirmed Jun. 12, 2003).

Lee et al., "Antenna Diversity for an OFDM System in a Fading Channel", Proceeding of IEEE MILCOM 1999, Nov. 1999, pp. 1104-1109.

Li et al., "Adaptive Antenna Arrays For OFDM Systems With Cochannel Interference", IEEE Transactions On Communications, vol. 47, No. 2, pp. 217-229, (Feb. 1999).

Love et al., "Equal Gain Transmission in Multiple-Input Multiple-Output Wireless Systems", Nov. 2002, Proceedings of IEEE Globecom, pp. 1124-1128.

Lucent Technologies, "Lucent Technologies: Chips Poised to Bring 'Blast' Multiple Input/Multiple Output Technology to Laptops, PDAs and Other Mobile Devices", Oct. 16, 2002, lucent.com.

Meyer-Ottens, et al. "Downlink Beamforming for W-CDMA Using Feedback and Interference Estimate", Mar. 9, 2001.

Morgan, "Interaction of Adaptive Antenna Arrays in an Arbitrary Environment", The Bell System Technical Journal, Jan. 1965, pp. 23-47.

Narula et al., "Efficient Use Of Side Information In Multiple-Antenna Data Transmission Over Fading Channels", IEEE Journal On Selected Areas In Communications, vol. 16, No. 8, pp. 1423-1436, (Oct. 1998).

Onggosanusi et al., "Performance Analysis Of Closed-Loop Transmit Diversity In The Presence Of Feedback Delay", IEEE Transactions On Communications, vol. 49, No. 9, pp. 1618-1630, (Sep. 2001).

Raleigh et al., "Spatio-Temporal Coding for Wireless Communication", IEEE Transactions on Communications, vol. 46, No. 3, Mar. 1998, pp. 357-366.

Sanchez et al., "CSMA/CA Beam Forming Antennas in Multi-hop Packet Radio"; Proc. For Swedish Workshop on Wireless Ad-Hoc Networks, Mar. 5-6, 2001.

Stridh et al., "MIMO Channel Capacity on a Measured Indoor Radio Channel at 5.8 GHz", Proc. of the Asilomar Conf. on Signals, Systems & Computers, vol. 1, Oct. 2000, pp. 733-737.

Stridh et al., "Spatial Characterization of Indoor Radio Channel Measurements at 5 GHz", SAM 2000, Mar. 2000, pp. 58-62.

Vaidyanathan et al., "The Role In Lossless Systems in Modern Digital Signal Processing: A Tutorial", IEEE Transactions on Education, vol. 32, Aug. 1989, pp. 181-197.

Wallace et al., "Experimental Characterization of the MIMO Wireless Channel: Data Acquisition and Analysis", Feb. 27, 2002, Department of Electrical and Computer Engineering, Brigham Young University.

Wennström et al., "On The Optimality And Performance Of Transmit And Receive Space Diversity In MIMO Channels", IEEE Seminar on Communications Systems from Concept to Implementations, (Dec. 12, 2001).

Wolniansky et al., "V-Blast: An Architecture for Realizing Very High Data Rates Over the Rich-Scattering Wireless Channel", Proc. ISSSE-98, Pisa, Italy, Sep. 29, 1998.

Yang et al., "Joint Transmitter - Receiver Optimization For Multi-Input Multi-Output Systems With Decision Feedback", IEEE Transactions On Information Theory, vol. 40, No. 5, pp. 1334-1347, (Sep. 1994).

Yang et al., "On Joint Transmitter and Receive Optimization for Multiple-Input-Multiple-Output (MIMO) Transmission Systems", IEEE Transactions on Communications, vol. 42, No. 12, Dec. 1994.

Yeh, "An Analysis of Adaptive Retransmission Arrays in a Fading Environment", The Bell System Technical Journal, Oct. 1970, pp. 1811-1825.

"Blast High-Level Overview", Lucent Technologies, Jul. 18, 2000.

"Lucent's 'Blast' Chips to Take Off in Wireless Market", EETimes.com, Oct. 16, 2002.

Ariyavisitakul et al., "Optimum Space-Time Processors With Dispersive Interference - Unified Analysis And Required Filter Span", 1999 IEEE International Conference On Communications, vol. 2, pp. 1244-1249, (1999).

Aziz et al., "Indoor Throughput and Range Improvements Using Standard Complaint AP Antenna Diversity in IEEE 802.11a and ETSI HIPERLAN/2", Vehicular Technology Conference, 2002, VTC 2001, Oct. 7-11, 2001, IEEE VTS $54^{th}$, vol. 4, pp. 2294-2298.

Bablan et al., "Optimum Diversity Combining and Equalization in Digital Data Transmission with Applications to Cellular Mobile Radio-Part II: Numerical Results"; May 1992; IEEE Transactions on Communications, vol. 30, No. 5; pp. 895-907.

Briesemeister et al., "Role-Based Multicast in Highly Mobile but Sparsely Connect Ad-Hoc Networks"; First Annual Workshop on Mobile Ad Hoc Networking & Computing; pp. 45-50; Aug. 2000.

Brunner et al., "Downlink Beamforming for WCDMA Based on Uplink Channel Parameters"; Proceedings of $3^{rd}$ European Personal Mobile Conference (EPMCC'99), Mar. 1999, pp. 334-339.

Chiu et al., "OFDM Receiver Design", EE225C, Fall 2000, University of California, Berkeley.

Chizhik et al., "Keyholes, Correlations, and Capacities of Multielement Transmit and Receiver Antennas", IEEE Transactions on Wireless Communications, vol., 1, No. 2, Apr. 2002, pp. 361-368.

Choi et al., "MISO CDMA Transmission with Simplified Receiver for Wireless Communication Handsets", IEEE Transactions on Communications, vol. 49, No. 5, May 2002.

Chuah et al., "Capacity of Multi-Antenna Array Systems in Indoor Wireless Environment", Nov. 1998, IEEE Globecom.

Golden et al., "Detection Algorithm and Initial Laboratory Results Using V-Blast Space-Time Communication Architecture", Electronic Letters, Jan. 7, 1999, vol. 35, No. 1.

Golden et al., "V-Blast: A High Capacity Space-Time Architecture for the Rich-Scattering Wireless Channel", Bell Laboratories, Lucent Technologies, Proc. Int'l Symposium on Advanced Radio Technologies, Boulder, CO, Sep. 10, 1998.

Golub et al., Matrix Computation, "7.3 Power Iterations", The Johns Hopkins University Press, Second Edition, pp. 351, (1983).

Heath et al., "A Simple Scheme for Transmit Diversity Using Partial Channel Feedback", Signals, Systems & Computers, Conference Record of the Thirty-Second Asilomar Conference, No. 1-4, 1998; vol. 2; pp. 1073-1078.

Irmer et al., "MISO Concepts for Frequency-Selective Channels", 2002 International Zurich Seminar on Broadband Communications Access, Feb. 19-21, 2002.

Iserte et al., "Iterative Algorithm for the Estimation of Distributed Sources Localization Parameters", SSP 2001, $11^{th}$ IEEE Workshop on Statistical Signal Processing, Aug. 2001.

Iserte et al., "Joint Beamforming Strategies in OFDM-MIMO Systems", ICASSP 2002, IEEE International Conference on Acoustics, Speech and Signal Processing, May 2002.

Iserte et al., "Pre-and Post-Beamforming in MIMO Channels Applied to HIPERLAN/2 and OFDM", IST Summit 2001, IST Mobile Communications Summit, Sep. 2001.

Ivrlac et al., "On Channel Capacity of Correlated MIMO Channels", ITG Fokusprojekt: Mobilkommunikation "Systeme mit Intelligenten Antennen", Iimenau, 2001.

Jakes, "Microwave Mobile Communications", Copyright 1974, pp. 313-320 and pp. 489-498.

Jungnickel et al., "A MIMO WLAN Based on Linear Channel Inversion", IEE Seminar-MIMO Communication Systems from Concept TO Implementation, Dec. 2001, pp. 20/1-20/6.

Jungnickel et al., "Performance of a MIMO System with Overlay Pilots", IEEE GlobeCom 2001, pp. 594-598.

Junqiang et al., "Spatial Multiuser Access with MIMO Smart Antennas for OFDM Systems", IEEE VTC 2001, Sep. 2001, pp. 1553-1557.

Lan Man Standards Committee Of The IEEE Computer Society, "Information Technology - Telecommunications And Information Exchange Between Systems - Local And Metropolitan Area Networks - Specific Requirements - Part 11: Wireless LAN Medium Access Control (MAC) And Physical Layer (PHY) Specifications", ANSI/IEEE Std 802.11, 1999 Edition (R2003), (Reaffirmed Jun. 12, 2003).

Lee et al., "Antenna Diversity for an OFDM System in a Fading Channel", Proceeding of IEEE MILCOM 1999, Nov. 1999, pp. 1104-1109.

Li et al., "Adaptive Antenna Arrays For OFDM Systems With Cochannel Interference", IEEE Transactions On Communications, vol. 47, No. 2, pp. 217-229, (Feb. 1999).

Love et al., "Equal Gain Transmission in Multiple-Input Multiple-Output Wireless Systems", Nov. 2002, Proceedings of IEEE Globecom, pp. 1124-1128.

Lucent Technologies, "Lucent Technologies: Chips Poised to Bring 'Blast' Multiple Input/Multiple Output Technology to Laptops, PDAs and Other Mobile Devices", Oct. 16, 2002, lucent.com.

Meyer-Ottens, et al. "Downlink Beamforming for W-CDMA Using Feedback and Interference Estimate", Mar. 9, 2001.

Morgan, "Interaction of Adaptive Antenna Arrays in an Arbitrary Environment", The Bell System Technical Journal, Jan. 1965, pp. 23-47.

Narula et al., "Efficient Use Of Side Information In Multiple-Antenna Data Transmission Over Fading Channels", IEEE Journal On Selected Areas In Communications, vol. 16, No. 8, pp. 1423-1436, (Oct. 1998).

Onggosanusi et al., "Performance Analysis Of Closed-Loop Transmit Diversity In The Presence Of Feedback Delay", IEEE Transactions On Communications, vol. 49, No. 9, pp. 1618-1630, (Sep. 2001).

Raleigh et al., "Spatio-Temporal Coding for Wireless Communication", IEEE Transactions on Communications, vol. 46, No. 3, Mar. 1998, pp. 357-366.

Sanchez et al., "CSMA/CA Beam Forming Antennas in Multi-hop Packet Radio"; Proc. For Swedish Workshop on Wireless Ad-Hoc Networks, Mar. 5-6, 2001.

Stridh et al., "MIMO Channel; Capacity on a Measured Indoor Radio Channel at 5.8 GHz", Proc. of the Asilomar Conf. on Signals, Systems & Computers, vol. 1, Oct. 2000, pp. 733-737.

Stridh et al., "Spatial Characterization of Indoor Radio Channel Measurements at 5 GHz", SAM 2000, Mar. 2000, pp. 58-62.

Vaidyanathan et al., "The Role In Lossless Systems in Modern Digital Signal Processing: A Tutorial", IEEE Transactions on Education, vol. 32, Aug. 1989, pp. 181-197.

Wallace et al., "Experimental Characterization of the MIMO Wireless Channel: Data Acquisition and Analysis", Feb. 27, 2002, Department of Electrical and Computer Engineering, Brigham Young University.

Wennström et al., "On The Optimality And Performance Of Transmit And Receive Space Diversity In MIMO Channels", IEEE Seminar on Communications Systems from Concept to Implementations, (Dec. 12, 2001).

Wolniansky et al., "V-Blast: An Architecture for Realizing Very High Data Rates Over the Rich-Scattering Wireless Channel", Proc. ISSSE-98, Pisa, Italy, Sep. 29, 1998.

Yang et al., "Joint Transmitter - Receiver Optimization For Multi-Input Multi-Output Systems With Decision Feedback", IEEE Transactions On Information Theory, vol. 40, No. 5, pp. 1334-1347, (Sep. 1994).

Yang et al., "On Joint Transmitter and Receive Optimization for Multiple-Input-Multiple-Output (MIMO) Transmission Systems", IEEE Transactions on Communications, vol. 42, No. 12, Dec. 1994.

Yeh, "An Analysis of Adaptive Retransmission Arrays in a Fading Environment", The Bell System Technical Journal, Oct. 1970, pp. 1811-1825.

"Blast High-High-Level Overview", Lucent Technologies, Jul. 18, 2000.

"Lucent's 'Blast' Chips to Take Off in Wireless Market", EETimes.com, Oct. 16, 2002.

Ariyavisitakul et al., "Optimum Space-Time Processors With Dispersive Interference - Unified Analysis And Required Filter Span", 1999 IEEE International Conference On Communications, vol. 2, pp. 1244-1249, (1999).

Aziz et al., "Indoor Throughput and Range Improvements Using Standard Complaint AP Antenna Diversity in IEEE 802.11a and ETSI HIPERLAN/2", Vehicular Technology Conference, 2002, VTC 2001, Oct. 7-11, 2001, IEEE VTS 54$^{th}$, vol. 4, pp. 2294-2298.

Bablan et al., "Optimum Diversity Combining and Equalization in Digital Data Transmission with Applications to Cellular Mobile Radio-Part II: Numerical Results"; May 1992; IEEE Transactions on Communications, vol. 30, No. 5; pp. 895-907.

Briesemeister et al., "Role-Based Multicast in Highly Mobile but Sparsely Connect Ad-Hoc Networks"; First Annual Workshop on Mobile Ad Hoc Networking & Computing; pp. 45-50; Aug. 2000.

Brunner et al., "Downlink Beamforming for WCDMA Based on Uplink Channel Parameters"; Proceedings of 3$^{rd}$ European Personal Mobile Conference (EPMCC'99), Mar. 1999, pp. 334-339.

Chiu et al., "OFDM Receiver Design", EE225C, Fall 2000, University of California, Berkeley.

Chizhik et al., "Keyholes, Correlations, and Capacities of Multielement Transmit and Receiver Antennas", IEEE Transactions on Wireless Communications, vol., 1, No. 2, Apr. 2002, pp. 361-368.

Choi et al., "MISO CDMA Transmission with Simplified Receiver for Wireless Communication Handsets", IEEE Transactions on Communications, vol. 49, No. 5, May 2002.

Chuah et al., "Capacity of Multi-Antenna Array Systems In Indoor Wireless Environment", Nov.1998, IEEE Globecom.

Golden et al., "Detection Algorithm and Initial Laboratory Results Using V-Blast Space-Time Communication Architecture", Electronic Letters, Jan. 7, 1999, vol. 35, No. 1.

Golden et al., "V-Blast: A Highly Capacity Space-Time Architecture for the Rich-Scattering Wireless Channel", Bell Laboratories, Lucent Technologies, Proc. Int'l Symposium on Advanced Radio Technologies, Boulder, CO, Sep. 10, 1998.

Golub et al., Matrix Computation, "7.3 Power Iterations", The Johns Hopkins University Press, Second Edition, pp. 351, (1983).

Heath et al., "A Simple Scheme for Transmit Diversity Using Partial Channel Feedback", Signals, Systems & Computers, Conference Record of the Thirty-Second Asilomar Conference, Nov. 1-4, 1998; vol. 2; pp. 1073-1078.

Irmer et al., "MISO Concepts for Frequency-Selective Channels", 2002 International Zurich Seminar on Broadband Communications Access, Feb. 19-21, 2002.

Iserte et al., "Iterative Algorithm for the Estimation of Distributed Sources Localization Parameters", SSP 2001, 11$^{th}$ IEEE Workshop on Statistical Signal Processing, Aug. 2001.

Iserte et al., "Joint Beamforming Strategies in OFDM-MIMO Systems", ICASSP 2002, IEEE International Conference on Acoustics, Speech and Signal Processing, May 2002.

Iserte et al., "Pre-and Post-Beamforming in MIMO Channels Applied to HIPERLAN/2 and OFDM", IST Summit 2001, IST Mobile Communications Summit, Sep. 2001.

Ivrlac et al., "On Channel Capacity of Correlated MIMO Channels", ITG Fokusprojekt: Mobilkommunikation "Systeme mit Intelligenten Antennen", Ilmenau, 2001.

Jakes, "Microwave Mobile Communications", Copyright 1974, pp. 313-320 and pp. 489-498.

Jungnickel et al., "A MIMO WLAN Based on Linear Channel Inversion", IEE Seminar-MIMO Communication Systems from Concept TO Implementation, Dec. 2001, pp. 20/1-20/6.

Jungnickel et al., "Performance of a MIMO System with Overlay Pilots", IEEE GlobeCom 2001, pp. 594-598.

Junqiang et al., "Spatial Multiuser Access with MIMO Smart Antennas for OFDM Systems", IEEE VTC 2001, Sep. 2001, pp. 1553-1557.

LAN MAN Standards Committee Of The IEEE Computer Society, "Information Technology - Telecommunications And Information Exchange Between Systems - Local And Metropolitan Area Networks - Specific Requirements - Part 11: Wireless LAN Medium Access Control (MAC) And Physical Layer (PHY) Specifications", ANSI/IEEE Std 802.11, 1999 Edition (R2003), (Reaffirmed Jun. 12, 2003).

Lee et al., "Antenna Diversity for an OFDM System in a Fading Channel", Proceeding of IEEE MILCOM 1999, Nov. 1999, pp. 1104-1109.

Li et al., "Adaptive Antenna Arrays For OFDM Systems With Cochannel Interference", IEEE Transactions On Communications, vol. 47, No. 2, pp. 217-229, (Feb. 1999).

Love et al., "Equal Gain Transmission in Multiple-Input Multiple-Output Wireless Systems", Nov. 2002, Proceedings of IEEE Globecom, pp. 1124-1128.

Lucent Technologies, "Lucent Technologies: Chips Poised to Bring 'Blast' Multiple Input/Multiple Output Technology to Laptops, PDAs and Other Mobile Devices", Oct. 16, 2002, lucent.com.

Meyer-Ottens, et al. "Downlink Beamforming for W-CDMA Using Feedback and Interference Estimate", Mar. 9, 2001.

Morgan, "Interaction of Adaptive Antenna Arrays in an Arbitrary Environment", The Bell System Technical Journal, Jan. 1965, pp. 23-47.

Narula et al., "Efficient Use Of Side Information In Multiple-Antenna Data Transmission Over Fading Channels", IEEE Journal On Selected Areas In Communications, vol. 16, No. 8, pp. 1423-1436, (Oct. 1998).

Onggosanusi et al., "Performance Analysis Of Closed-Loop Transmit Diversity In The Presence Of Feedback Delay", IEEE Transactions On Communications, vol. 49, No. 9, pp. 1618-1630, (Sep. 2001).

Raleigh et al., "Spatio-Temporal Coding for Wireless Communication", IEEE Transactions on Communications, vol. 46, No. 3, Mar. 1998, pp. 357-366.

Sanchez et al., "CSMA/CA Beam Forming Antennas in Multi-hop Packet Radio"; Proc. For Swedish Workshop on Wireless Ad-Hoc Networks, Mar. 5-6, 2001.

Stridh et al., "MIMO Channel Capacity on a Measured Indoor Radio Channel at 5.8 GHz", Proc. of the Asilomar Conf. on Signals, Systems & Computers, vol. 1, Oct. 2000, pp. 733-737.

Stridh et al., "Spatial Characterization of Indoor Radio Channel Measurements at 5 GHz", SAM 2000, Mar. 2000, pp. 58-62.

Vaidyanathan et al., "The Role In Lossless Systems in Modern Digital Signal Processing: A Tutorial", IEEE Transactions on Education, vol. 32, Aug. 1989, pp. 181-197.

Wallace et al., "Experimental Characterization of the MIMO Wireless Channel: Data Acquisition and Analysis", Feb. 27, 2002, Department of Electrical and Computer Engineering, Brigham Young University.

Wennström et al., "On The Optimality And Performance Of Transmit And Receive Space Diversity In MIMO Channels", IEEE Seminar on Communications Systems from Concept to Implementations, (Dec. 12, 2001).

Wolniansky et al., "V-Blast: An Architecture for Realizing Very High Data Rates Over the Rich-Scattering Wireless Channel", Proc. ISSSE-98, Pisa, Italy, Sep. 29, 1998.

Yang et al., "Joint Transmitter - Receiver Optimization For Multi-Input Multi-Output Systems With Decision Feedback", IEEE Transactions On Information Theory, vol. 40, No. 5, pp. 1334-1347, (Sep. 1994).

Yang et al., "On Joint Transmitter and Receive Optimization for Multiple-Input-Multiple-Output (MIMO) Transmission Systems", IEEE Transactions on Communications, vol. 42, No. 12, Dec. 1994.

Yeh, 'An Analysis of Adaptive Retransmission Arrays in a Fading Environment", The Bell System Technical Journal, Oct. 1970, pp. 1811-1825.

* cited by examiner

CONTROL OF POWER AMPLIFIERS IN DEVICES USING TRANSMIT BEAMFORMING

CROSS REFERENCE TO RELATED APPLICATION(S)

This application is a continuation of U.S. application Ser. No. 10/867,249 filed Jun. 14, 2004 which is also a continuation of U.S. application Ser. No. 10/249,063, filed Mar. 13, 2003, now U.S. Pat. No. 6,871,049, which in turn claims priority to U.S. Provisional Application No. 60/365,811, filed Mar. 21, 2002, to U.S. Provisional Application No. 60/365,775 filed Mar. 21, 2002 and to U.S. Provisional Application No. 60/365,797, filed Mar. 21, 2002, which are incorporated by reference as if fully set forth.

BACKGROUND OF THE INVENTION

The present invention relates to radio communication devices.

In a radio transmitter, a power amplifier is included to amplify the radio frequency signal to be transmitted via an antenna. The power amplifier is controlled through a variety of mechanisms to output radio frequency energy at a desired power level. Generally, the maximum transmit power at the antenna is limited by regulatory requirements in the band of operation.

Typically, the power amplifier dominates the power consumption in the radio transmitter. Power amplifier efficiency is the ratio of the output power of the power amplifier to the power it consumes, $PA_{eff} = P_{out}/P_{cons}$.

The gain of the power amplifier is the ratio of the output power to the input power, $PA_{gain} = PA_{out}/PA_{in}$. The output power can be controlled by changing the input power level. For a desired maximum output power, the efficiency of the power amplifier can be controlled by adjusting the bias current of the power amplifier. The power consumption of the power amplifier is a function of the DC current which is determined by the power amplifier bias current and the output power:

$$P_{cons} = PA_{dc} + f(P_{out}).$$

High power amplifier efficiency introduces non-linearities that affect the integrity of the transmit signal. Therefore, the operating point of the power amplifier is selected by trading efficiency versus linearity.

Transmit beamforming has been proposed as a way to improve data rate and range of signals transmitted to another device. Multiple transmit antennas are used at the transmitter of one device when transmitting signals to another device, whereby weighted versions of the baseband signal are upconverted and transmitted by corresponding ones of a plurality of antennas. The transmit antenna weights are computed by maximizing a cost function (e.g., signal-to-noise ratio at the receiver of the other device). One example and application of transmit beamforming is disclosed in U.S. patent application Ser. No. 10/174,728, filed Jun. 19, 2002 and entitled "System and Method for Antenna Diversity Using Joint Maximal Ratio Combining," the entirety of which is incorporated herein by reference.

According to these techniques each transmitter requires a power amplifier to amplify the signal at the input to the antenna to a desired level. For N antennas, the total power consumption could reach N times the power consumption of a single antenna system. Any given power amplifier may be required to transmit at a level up to a maximum power level. What is needed is a procedure and system to optimize the DC power consumption of the power amplifiers when transmitting from multiple antennas.

SUMMARY OF THE INVENTION

A radio transmitter optimizes the efficiency of each of a plurality of power amplifiers that amplify a corresponding one of a plurality of radio frequency signals for transmission by a corresponding one of a plurality of antennas. Using transmit beamforming, the power of each amplified signal output by the power amplifiers may not be the same for all the power amplifiers, and may vary with changes in the communication channel between the transmitting device and receiving device. Each of the plurality of power amplifiers is controlled to operate with one or more operating parameters that optimize the efficiency for an output power level of corresponding ones of the radio frequency signals. By adjusting one or more operating parameters of each power amplifier according to changing requirements (e.g., the destination device and channel conditions), the efficiency of each power amplifier can be optimized. Consequently, one or more of the power amplifiers are operated with one or more operating parameters that reflects the output power actually needed for the corresponding radio frequency signal to be transmitted.

Other objects and advantages will become more apparent when reference is made to the following description taken in conjunction with the accompanying drawings.

DETAILED DESCRIPTION OF THE DRAWINGS

Figure 1:
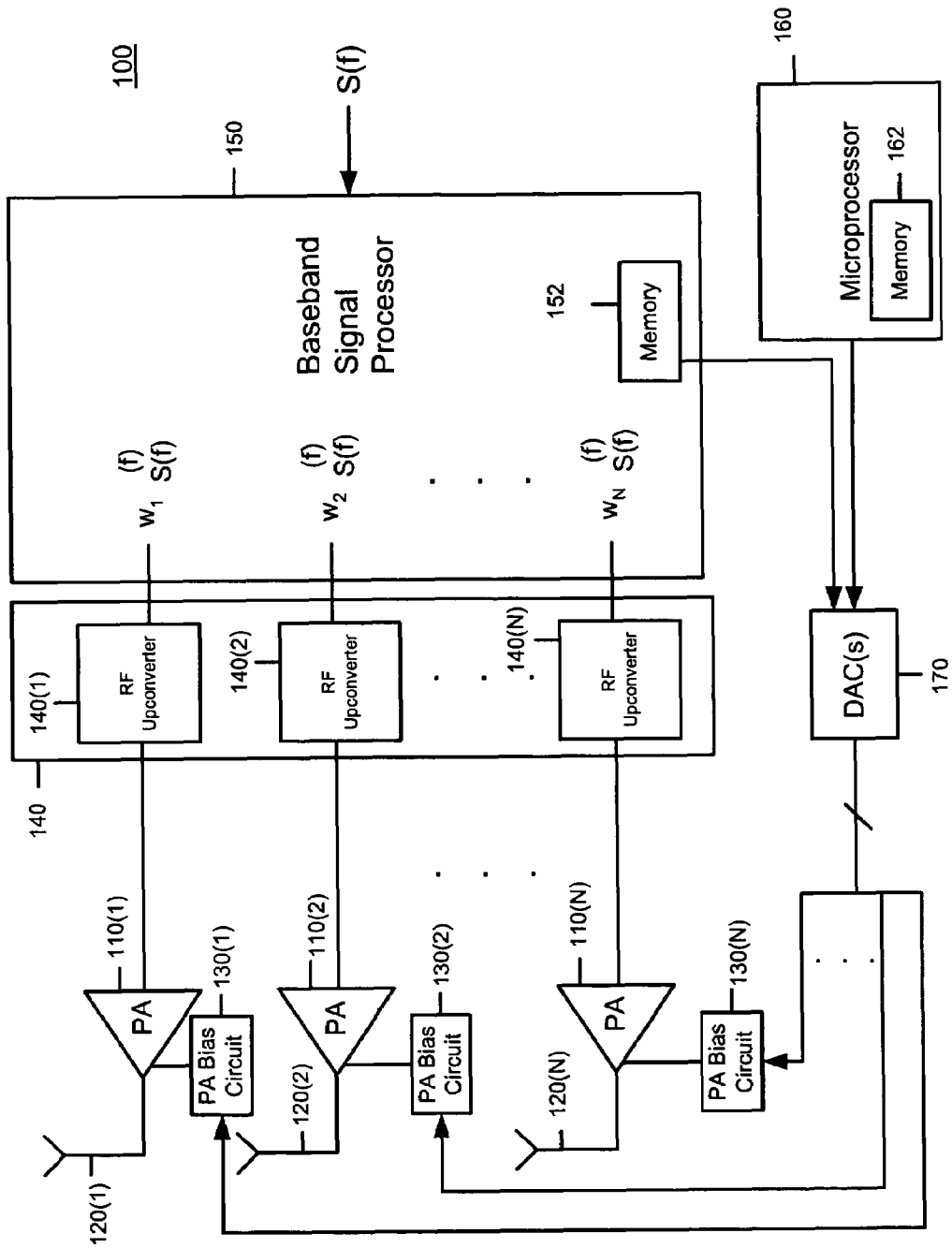
FIG. 1 is a block diagram of a system that optimizes the efficiency of a plurality of power amplifiers in a beamforming radio transmitter system according to a first embodiment.

Referring first to FIG. 1, a beamforming radio transmitter system is shown generally at reference numeral 100. The system 100 comprises a plurality of power amplifiers 110(1) through 110(N), each of which is coupled to a corresponding one of a plurality of transmit antennas 120(1) through 120(N). Each power amplifier 110(1) to 110(N) has a corresponding power amplifier bias circuit 130(1) to 130(N).

In a radio frequency (RF) transmitter section 140, there are a plurality of RF upconverters 140(1) through 140(N) each of which supplies a radio frequency signal to a corresponding one of the power amplifiers 110(1) to 110(N). The details of each RF upconverter 140(1) through 140(N) are not relevant to the beamforming transmitter system described herein. Further details of a suitable radio transmitter section are disclosed in, for example, commonly assigned and co-pending U.S. patent application Ser. No. 10/065,388 filed Oct. 11, 2002, and entitled "Multiple-Input Multiple-Output Radio Transceiver," the entirety of which is incorporated herein by reference. For example, there may be filters, oscillators, etc., between the RF section 140 and the power amplifiers 110(1) to 110(N), as well as filters between the power amplifiers 110(1) to 110(N) and transmit antennas 120(1) to 120(N).

The inputs to the RF section 140 are baseband signals $w1(f)S(f)$ through $wN(f)S(f)$, which are individual baseband signals produced by weighting the baseband signal $S(f)$ with each of the plurality of transmit weights $w_1(f)S(f)$ through $w_N(f)S(f)$. Transmit weight $w_1(f)$ corresponds to the signal to be transmitted by antenna 120(1), transmit weight $w_2(f)$ corresponds to the signal to be transmitted by antenna 120(2), and so on. The signal $S(f)$ may be one signal or packet to be weighted, upconverted and transmitted simultaneously by the plurality of antennas 120(1) through 120(N), or may be a stream of multiple packets to weighted, upconverted and transmitted simultaneously by the plurality of antennas 120(1) through 120(N).

The weighting computations may be performed in a baseband signal processor 150. For example, the baseband signal processor 150 may perform the necessary baseband modulation and formatting depending on the particular communication protocol employed, such as, for example, IEEE 802.11x. The baseband signal processor 50 may be implemented by a plurality of gates that execute the necessary instructions in an application specific integrated circuit (ASIC), dedicated microprocessor programmed with suitable instructions encoded on a memory medium, etc. The weighted baseband signals $w_1(f)S(f)$ through $w_N(f)S(f)$ are supplied as input to a corresponding one of the RF upconverters 140(1) through 140(N).

Figure 5:
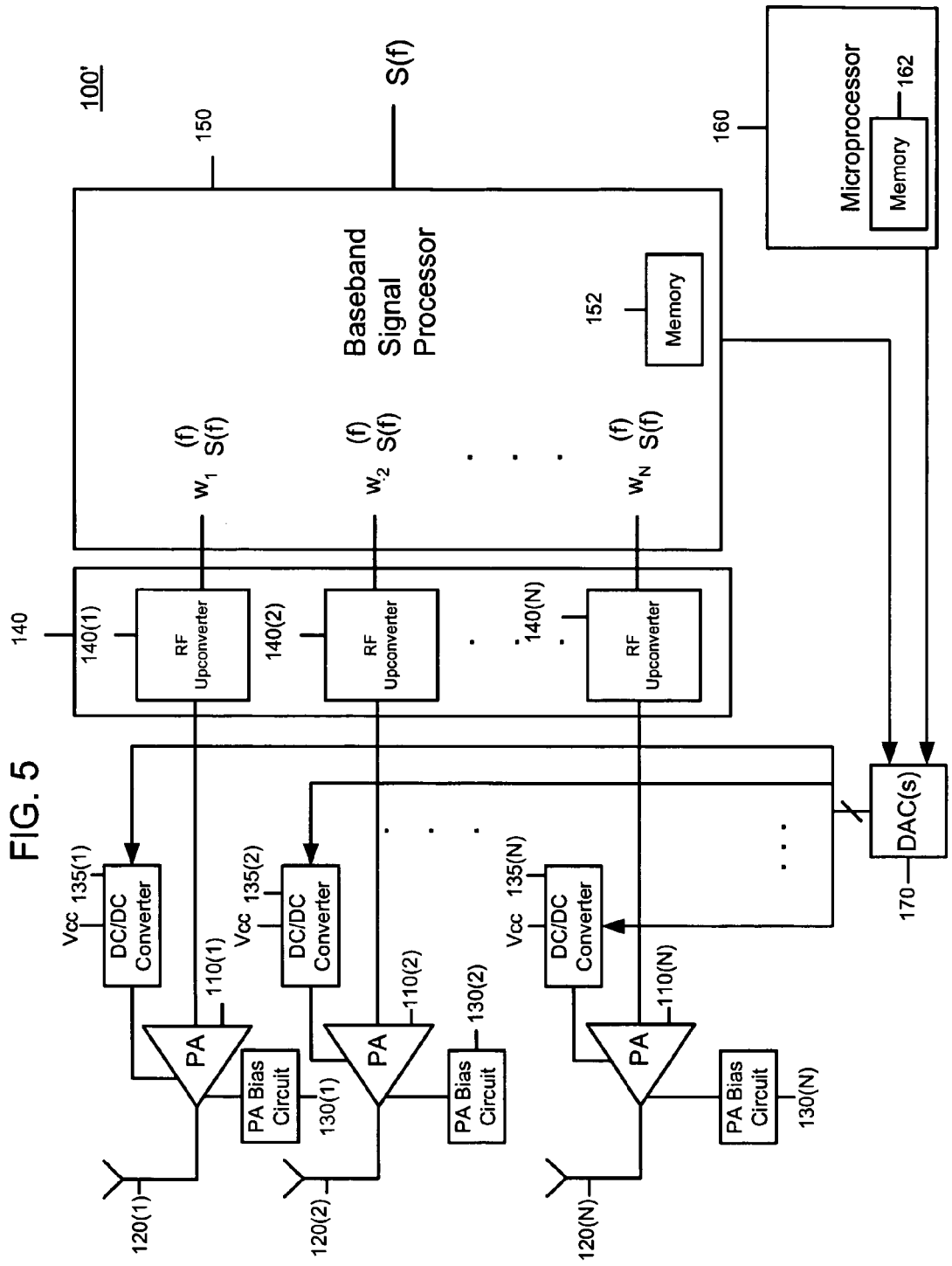
FIG. 5 is a block diagram of a system that optimizes the efficiency of a plurality of power amplifiers in a beamforming radio transmitter system according to a second embodiment.
Figure 7:
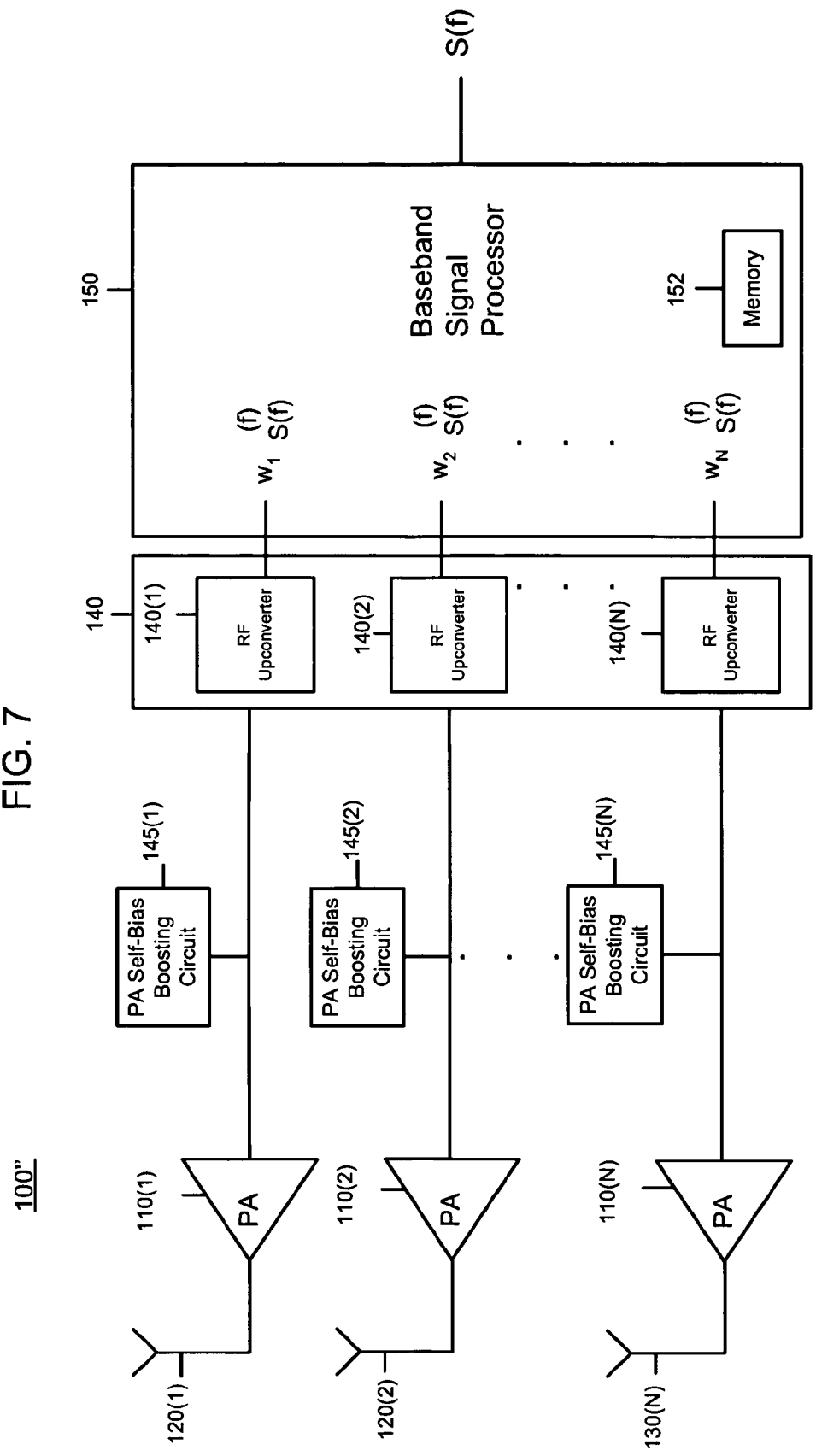
FIG. 7 is a block diagram of a system that optimizes the efficiency of a plurality of power amplifiers in a beamforming radio transmitter system according to a third embodiment.

When transmitting RF signals representing the weighted signals, the power consumption characteristics of the power amplifiers are controlled by adjusting one or more power amplifier operational parameters in order to optimize the efficiency of the power amplifiers. There are several ways in which the power amplifier efficiency can be optimized. FIG. 1 shows one mechanism in which the power amplifier bias circuits are controlled, FIG. 5 shows another mechanism in which the operating voltage to each power amplifier is adjusted and FIG. 7 illustrates still another mechanism in which the self-bias boosting circuits are used to automatically bias the power amplifiers. In each of these embodiments, one or more of the power amplifiers are operated with one or more operating parameters that reflects the output power actually needed for the corresponding transmit signal.

The maximum total radiated power from all the transmit antennas 120(1) through 120(N), $PA_{out\_total}$, must not exceed the limits of the regulatory requirements:

$PA_{out\_total}=PA_{out(1)}+PA_{out(2)}+\ldots+PA_{out(N)}<$Max.power.

The regulatory requirements on the maximum transmit power is independent of the number of transmit antennas.

Figure 2:
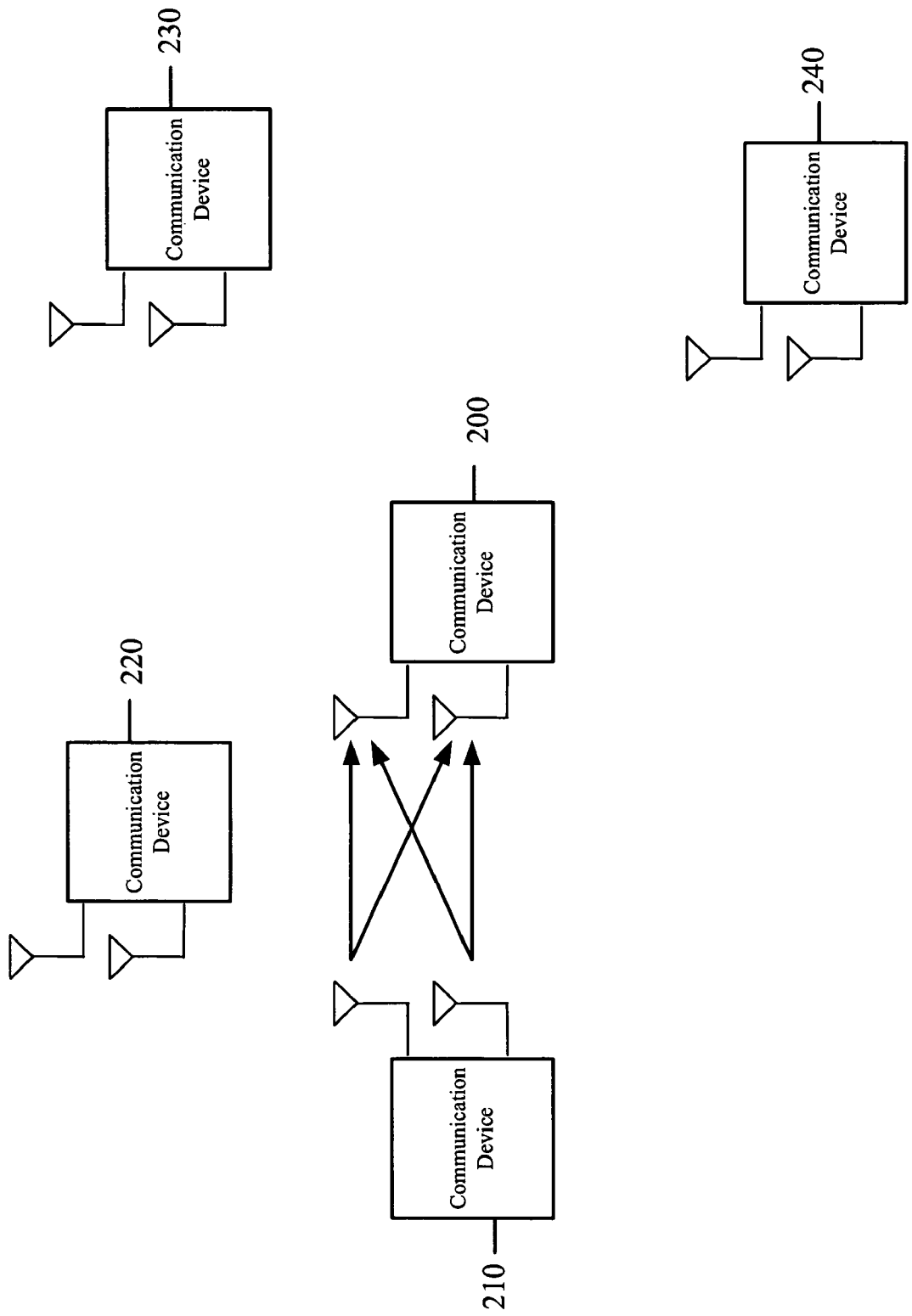
FIG. 2 is a block diagram showing multiple communication devices that may communicate between each other using transmit beamforming techniques.

With reference to FIG. 2, a plurality of radio communication devices 200, 210, 220, 230 and 240 having transmit beamforming capabilities is shown. The channel transfer function between any two communication devices is different. The optimum transmit weights depend on the channel transfer function between any two devices. The transmit weights of the transmitting device are different for each intended receiving device. Each communication device shown in FIG. 2 has two antennas for transmission and receptions, as an example.

It is statistically possible that for a particular channel, the optimum transmit antenna weights may dictate that all of the transmit power be generated through one antenna, and for a different channel, that all of the transmit power be generated through a different antenna. The power amplifiers would have to be biased such that they are all capable of transmitting all of the power. Therefore, the DC power consumption of each power amplifier is the same as the DC power of a single power amplifier when a single antenna is used $PA_{dc\_total}=PA_{dc(1)}+PA_{dc(2)}+\ldots+PA_{dc(N)}=N\,PA_{dc(1)}$ Although the total output power is the same, the DC power consumption of N power amplifiers is N times the DC power of a single power amplifier in the single antenna case. This would result in substantial power consumption and is inefficient because for one or more of the transmit signals, the corresponding power amplifier need not be operated with parameters sufficient for maximum power amplification.

Figure 3:
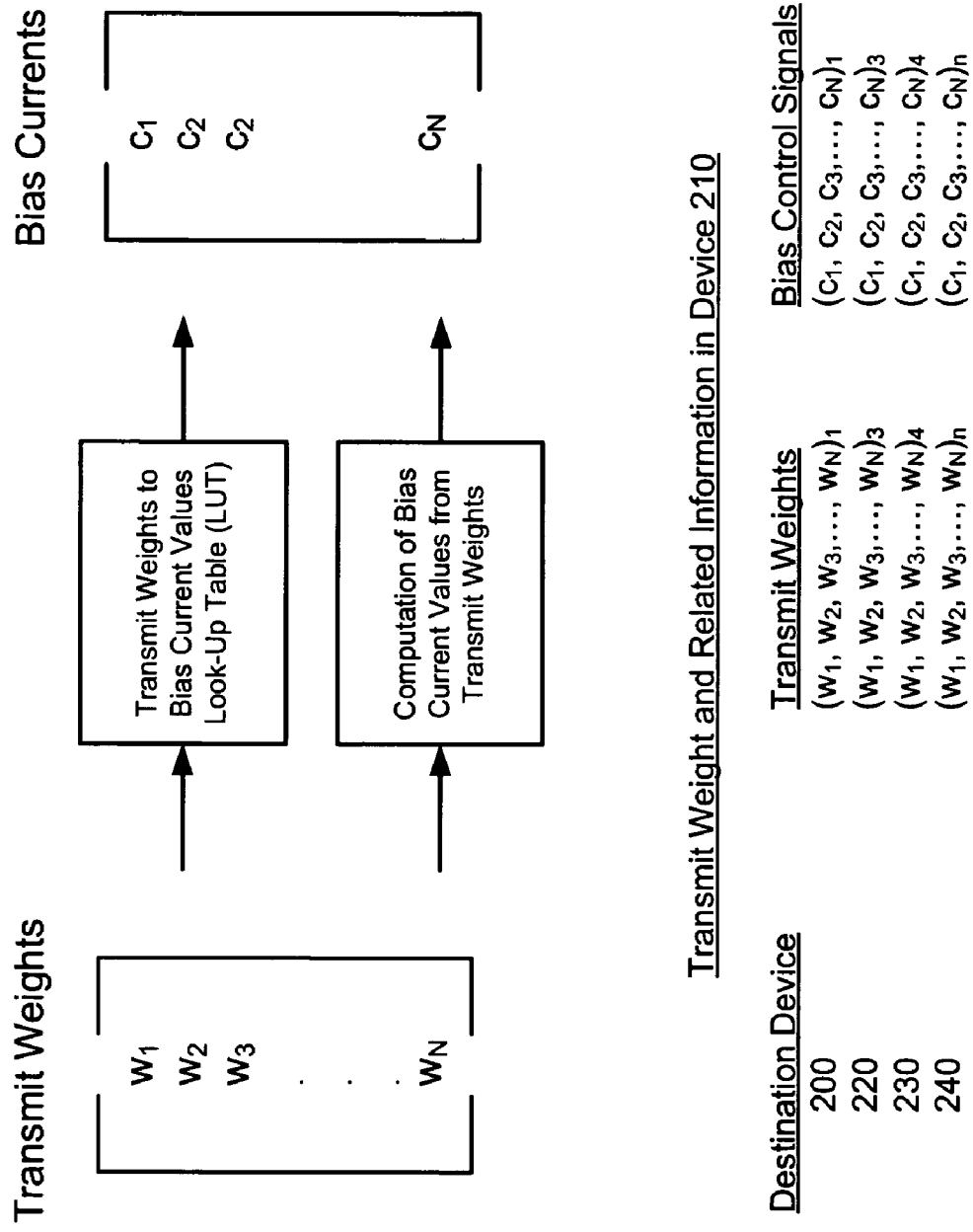
FIG. 3 is a diagram that illustrates the data that may be used to generate parameters that optimize the efficiency of the power amplifiers.

With reference to FIG. 3 in conjunction with FIG. 1, a procedure is described to dynamically adjust the bias supplied to the power amplifiers so as to optimize their DC power consumption. In any given communication device, the transmit antenna weights for each destination device are computed a priori and stored in a table at the transmitting station. For example, the transmit antenna weights may be stored indexed against an identifier of the destination device, such as the medium access control (MAC) address of the destination device. Techniques that a device may use to compute the transmit antenna weights may vary, and one such technique is described in the aforementioned co-pending U.S. non-provisional patent application referred to above.

In each communication device, transmit weights are used to weight a baseband signal to produce weighted signals representing a packet of information to be transmitted to a destination device. The bias circuits 130(1) through 130(N) for power amplifiers 110(1) through 110(N) control the bias voltage or current for each power amplifier. Information necessary to control the bias circuits is derived from the transmit weights. The bias circuits 130(1) through 130(N) for power amplifiers 110(1) through 110(N) can be adjusted on a per-packet basis to account for changes in the transmit weights that are the result of changing channel conditions between the transmitting device and a particular destination device. By adjusting the bias for each power amplifier, the gain and linearity for each power amplifier, as well as the DC current drain, is adjusted, to optimize the efficiency of the power amplifier at a required level of output power.

A microprocessor 160 may be used to control the bias voltages or currents of the bias circuits 130(1) through 130(N) by deriving digital current (or voltage values) that are converted to analog signals for each bias circuit by one or more digital-to-analog converters (DAC(s)) 170. The intelligence to derive the bias circuit control signals may alternatively be included in the baseband signal processor. Updated values for the transmit weights are stored in a memory 162 associated with the microprocessor and/or in a memory 152 associated with the baseband signal processor 150.

It may be desirable for all the power amplifiers to have the same efficiency. When a transmit packet is being prepared for transmission, the transmit antenna weights are used to compute the maximum transmit power at each antenna:

$P_n=\int |w_n(f)|^2 df$

The maximum transmit power at each antenna is used to compute the power amplifier bias (voltage or current) for the specified output power to optimize efficiency. As shown in FIG. 3, the bias control signals (e.g., bias control current values or bias control voltage values) are computed from the transmit weights using a mathematic formula computation, or a look-up-table (LUT) that stores control values corresponding to antenna weights. The power amplifier biases may be adjusted with the computed values before the start of the packet transmission for every transmitted packet so that there is no need to store state for the bias control signals. This process is repeated for every new packet. Alternatively, the biases can be left unchanged from transmit packet to transmit packet until there is a change in the transmit weights.

Figure 4:
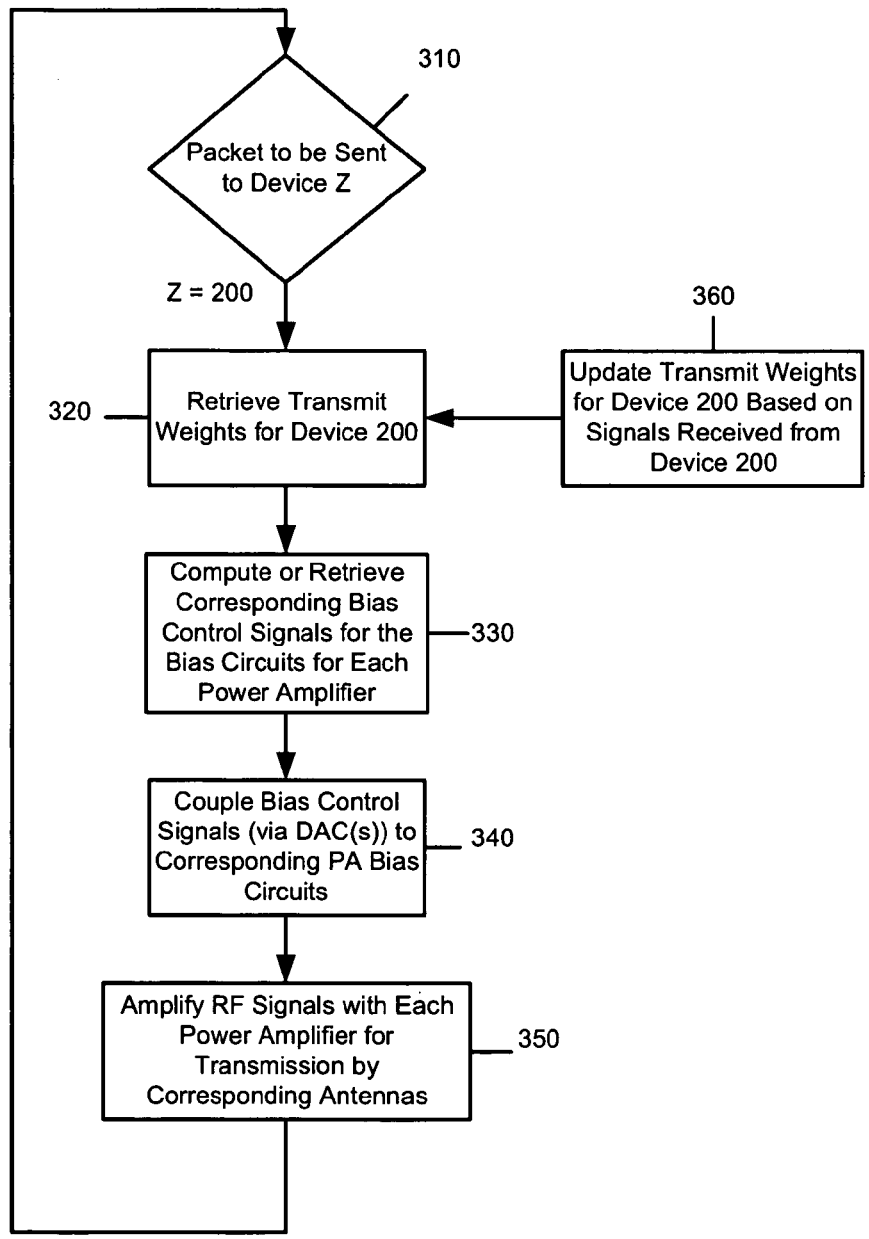
FIG. 4 is a flow chart depicting a method for controlling the power amplifiers in the system shown in FIG. 1.

To explain this in connection with a specific example, reference is made to a process 300 represented by the flow chart shown in FIG. 4, in which device 210 is preparing to transmit a packet to device 200. In step 310, a processor (baseband signal processor 150 or microprocessor 160) in device 210 determines that a packet is to be transmitted to device 200. The transmit weights for device 200 (stored in device 210) are retrieved in step 320, and in step 330, the bias control signals are computed for the bias circuits for each power amplifier. In step 340, the bias control signals are converted to analog signals and coupled to the bias circuits. In step 350, the RF signals coupled to each amplifier are amplified by the corresponding power amplifier for transmission by the corresponding antenna. This procedure optimizes the DC power consumption of each power amplifier and will approach the total power amplifier DC power consumption of the single antenna/single power amplifier case. The transmit weights may be updated (based on each packet received from device 200) in step 360.

Turning to FIG. 5, a beamforming radio transmitter system 100' having many elements in common with the beamforming radio transmitter system 100 shown in FIG. 1, with the exception of a plurality of DC/DC converter circuits 135(1) to 135(N) for each power amplifier 110(1) to 110(N). Rather than control the power amplifier bias circuits 130(1) to 130 (N), operation of the power amplifiers 110(1) to 110(N) is controlled by adjusting the operating voltage used by each power amplifier through the DC/DC converter circuits 135(1) to 135(N). Normally, the operating voltage used by a power amplifier, referred to as Vcc, is fixed. However, if a signal is to be amplified by the power amplifier at a relatively low level compared to Vcc, then the power amplifier will not be operated efficiently at an operating voltage equal to Vcc when amplifying a signal at that lower level. Accordingly, the operating voltage to each power amplifier is adjusted according to the output power level required by that amplifier. Each DC/DC converter 135(1) to 135(N) is coupled to Vcc, and is controlled by a control signal to convert the voltage Vcc to an operating voltage at a level anywhere from a minimum voltage level up to Vcc, according to the transmit weight for the corresponding power amplifier.

The operating voltage control signals for each DC/DC converter 135(1) to 135(N) may be generated from the transmit weights in a manner similar to that shown in FIG. 3, either by way of a mathematical computation or a look-up-table. Digital DC/DC converter control signals computed by either the microprocessor 160 or baseband signal processor 150 are converted to analog operating voltage control signals by one or more DAC(s) 170 and coupled to the corresponding DC/DC converter 135(1) to 135(N).

A procedure 400 for optimizing the power amplifiers in the embodiment of FIG. 5 is shown in FIG. 6, again in connection with the example where device 210 is preparing to transmit a packet to device 200. In step 410, a processor (baseband signal processor 150 or microprocessor 160) in device 210 determines that a packet is to be transmitted to device 200. The transmit weights for device 200 (stored in device 210) are retrieved in step 420, and in step 430, the operating voltage control signals are computed for the DC/DC converter for each power amplifier. In step 440, the operating voltage control signals are converted to analog signals and coupled to the DC/DC converters. In step 450, the RF signals coupled to each amplifier are amplified by the corresponding power amplifier for transmission by the corresponding antenna. The transmit weights may be updated (based on each packet received from device 200) in step 460.

It may be desirable to control both the bias and operating voltage of each power amplifier, thereby combining the techniques shown in FIGS. 1 and 5.

Turning to FIG. 7, a beamforming radio transmitter system 100" is shown according to a third embodiment. The system 100" is similar to radio transmitter system 100 except that it includes power amplifier self-bias boosting circuits 145(1) to 145(N) instead of the bias circuits 130(1) to 130(N). As is known in the art, self-bias boosting circuits automatically bias a power amplifier by an amount according to the level of the input signal supplied to the power amplifier, thereby providing the necessary bias to the power amplifier to amplify that input signal with optimized efficiency. Self-bias boosting circuits are known in the art and are not described in detail herein. The plurality of RF signals output by the RF upconverters 140(1) to 140(N) are weighted according to the transmit weights w1(f)S(f) through wN(f)S(f), and therefore will be at respective power levels according to these weights. The self-bias boosting circuits 145(1) to 145(N) will detect the power levels of these signals and automatically provide the appropriate bias to the associated power amplifiers 110(1) to 110(N) to optimize the efficiency of those power amplifiers when amplifying the corresponding RF signal.

Figure 8:
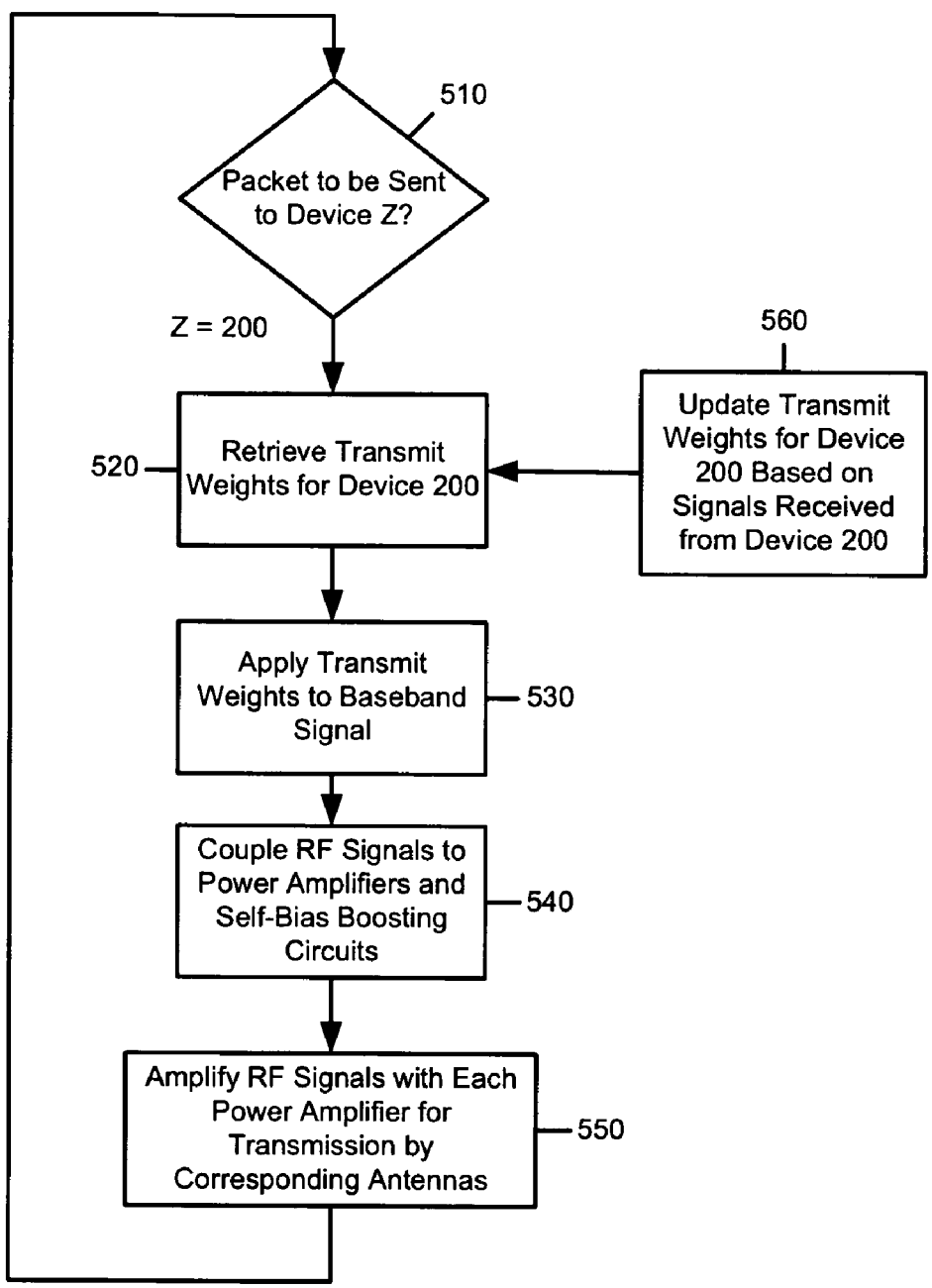
FIG. 8 is a flow chart depicting a method for controlling the power amplifiers in the system shown in FIG. 7.

A procedure 500 for optimizing the power amplifiers in the embodiment of FIG. 7 is shown in FIG. 8, in connection with the example where device 210 is preparing to transmit a packet to device 200. In step 510, a processor (baseband signal processor 150 or microprocessor 160) in device 210 determines that a packet is to be transmitted to device 200. The transmit weights for device 200 (stored in device 210) are retrieved in step 520, and in step 530 transmit weights are applied to the baseband signal to be transmitted to generate a plurality of weighted baseband signals. In step 540, the corresponding upconverted RF signals are coupled to the power amplifiers 110(1) to 110(N) and their corresponding self-bias boosting circuits 145(1) to 145(N). The self-bias boosting circuits 145(1) to 145(N) sense the power level of the RF signals and adjust the bias to the corresponding power amplifiers accordingly to optimize their operation when amplifying the corresponding RF signal. In step 550, the RF signals are amplified and coupled to the corresponding antenna for transmission. The transmit weights may be updated (based on each packet received from device 200) in step 560.

It may be desirable to control the operating voltage of each power amplifier in conjunction with the self-bias boosting circuits, thereby combining the techniques shown in FIGS. 5 and 7.

Furthermore, it may be desirable to adjust one or more operating parameters of one, some, but not all of the power amplifiers according to changing requirements. For example, in order to save implementation complexity, certain ones of the power amplifiers can be operated with operational parameters at nominal conditions suitable for any degree of power amplification, while other ones of the power amplifiers can be adjusted dynamically using any of the techniques described herein.

Figure 6:
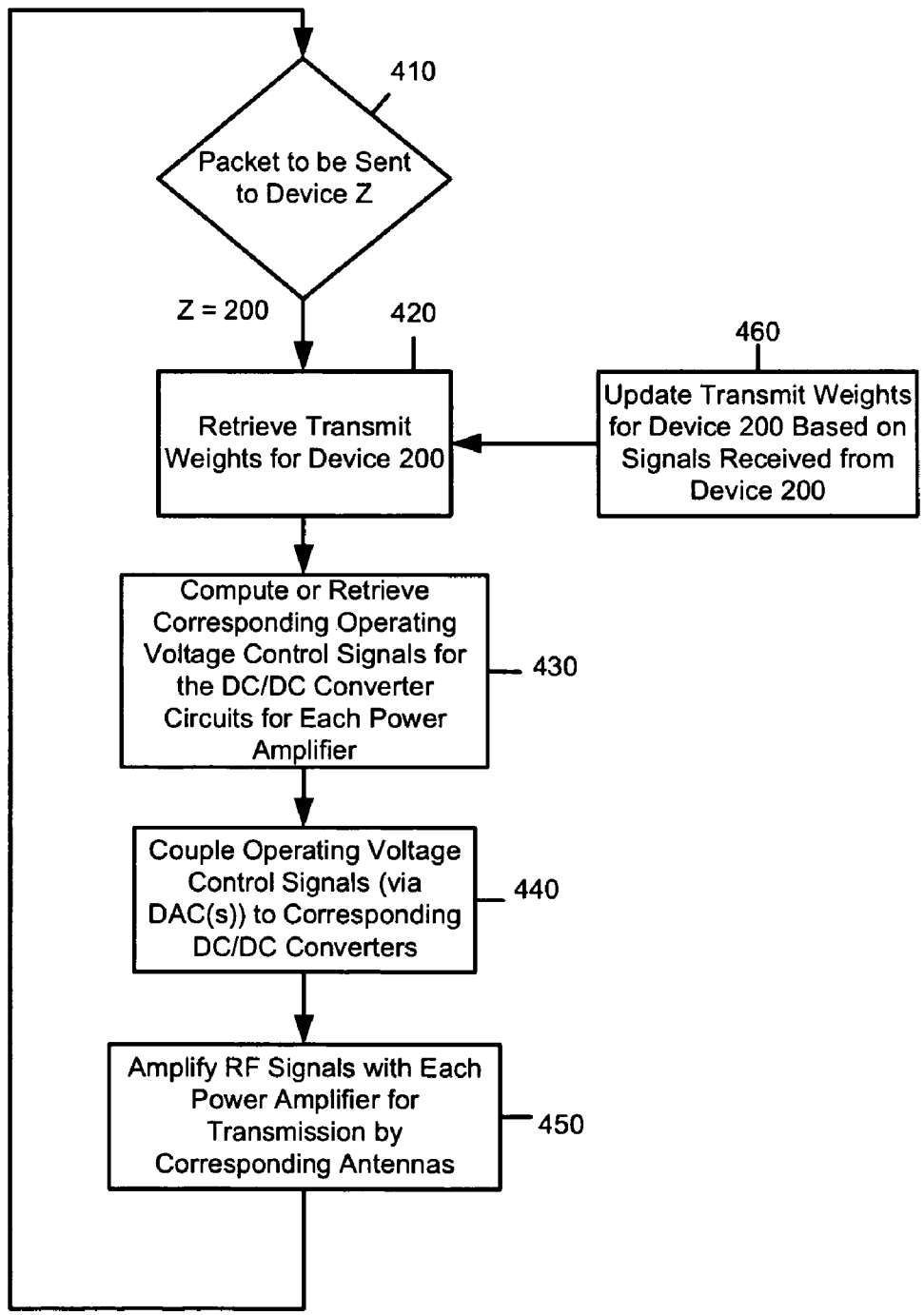
FIG. 6 is a flow chart depicting a method for controlling the power amplifiers in the beamforming radio transmitter system of FIG. 5.

The processes shown in FIGS. 4 and 6 for computing the control signals for the power amplifier may be implemented by instructions stored or encoded on a processor readable medium (e.g., memory associated with the microprocessor shown in FIGS. 1 and 5). The microprocessor would execute those instructions to generate the power amplifier control signals.

In summary, a method and a radio frequency transmission system is provided for optimizing the efficiency of each of a plurality of power amplifiers that amplify corresponding ones of a plurality of radio frequency signals for transmission by corresponding ones of a plurality of antennas. Each of the power amplifiers is controlled to operate with one or more operating parameters that optimize the efficiency for corresponding output power levels of corresponding radio frequency signals. The operating parameters that are optimized may be the bias voltage or current supplied to the power amplifiers, the operating voltage of the power amplifiers, or a combination thereof. In addition, the power amplifiers may be automatically biased by supplying signals to self-bias boosting circuits, each associated with a corresponding power amplifier, whereby the self-bias boosting circuit sets the bias of the corresponding amplifier depending on the level of input signal supplied to the power amplifier for amplification.

Further, a radio frequency signal transmission system is provided comprising a plurality of power amplifiers that amplify corresponding ones of a plurality of radio frequency signals for transmission by corresponding ones of a plurality of antennas. Each power amplifier is responsive to a corresponding control signal that adjusts at least one operational parameter to optimize the power amplifier efficiency for a corresponding output power level of the corresponding radio frequency signal. The at least one operational amplifier may be a bias current or voltage or an operating voltage, or a combination of both. Alternatively, a plurality of self-bias boosting circuits may be provided, each associated with corresponding ones of the plurality of power amplifiers, wherein each self-bias boosting circuit biases the corresponding power amplifier according to the power level of the corresponding radio frequency signal supplied as input to it.

Moreover, a processor readable medium is provided, wherein the medium is encoded with instructions that, when executed by a processor, cause the processor to generate power amplifier control signals based on corresponding ones of a plurality of transmit weights associated with the plurality of radio frequency signals to be simultaneously transmitted by corresponding antennas, wherein the power amplifier control signals adjust at least one operational parameter that optimizes the efficiency of a corresponding power amplifier for a corresponding output power level of the corresponding radio frequency signal The above description is intended by way of example only.

What is claimed is:

1. A radio transmitter, comprising:
a baseband signal processor configured to weight each of a plurality of digital baseband transmit signals with a corresponding one of a plurality of transmit weights to produce a plurality of digital weighted signals;
a digital to analog converter configured to convert each of the plurality of transmit weights to an analog bias signal;
a plurality of amplifiers, each amplifier configured to amplify an upconverted digital weighted signal as a corresponding radio frequency signal;
a plurality of bias circuits, each bias circuit corresponding to one of the plurality of amplifiers and configured to control the bias of the corresponding amplifier according to the transmit weights applied to the corresponding baseband transmit signal; and
a plurality of antennas, each antenna corresponding to one of the plurality of amplifiers, configured to simultaneously transmit the radio frequency signals.

2. The transmitter of claim 1, in which each of the bias circuits includes a self-bias boosting circuit.

3. The transmitter of claim 1, further comprising:
a plurality of DC/DC converters, each configured to produce a control voltage based on the transmit weights in order to control the operating voltage of the corresponding amplifier.

4. The transmitter of claim 3, in which each of the bias circuits includes a self-bias boosting circuit.

5. The transmitter of claim 1, further comprising:
a memory for storing the transmit weights, wherein the bias circuits use a lookup table to derive the analog bias signal from the stored transmit weights.

6. The transmitter of claim 1, further comprising:
an upconverter configured to process the digital weighted signals to produce the radio frequency signals.

7. The transmitter of claim 1, wherein the transmit weights are derived based on a channel transfer function between the transmitter and an intended receiving device.

8. The transmitter of claim 7, wherein the baseband signal comprises information packets and the bias circuits adjust the bias signals on a per-packet basis to account for changes in the transmit weights that are the result of changing channel conditions between the transmitter and the intended receiving device.

9. The transmitter of claim 1, wherein the antennas perform transmit beamforming.

10. A radio transmitter, comprising:
a baseband signal processor configured to weight each of a plurality of digital baseband transmit signals with a corresponding one of a plurality of transmit weights to produce a plurality of digital weighted signals;
a digital to analog converter configured to convert each of the plurality of transmit weights to an analog bias signal;
a plurality of amplifiers, each amplifier configured to amplify an upconverted digital weighted signal as a corresponding radio frequency signal;
a plurality of DC/DC converters, each DC/DC converter corresponding to one of the plurality of amplifiers and configured to control the operating voltage of the corresponding amplifier according to the transmit weights applied to the corresponding baseband transmit signal; and
a plurality of antennas, each antenna corresponding to one of the plurality of amplifiers, configured to simultaneously transmit the radio frequency signals.

11. The transmitter of claim 10, further comprising:
a memory for storing the transmit weights, wherein the bias circuits use a lookup table to derive the analog bias signal from the stored transmit weights.

12. The transmitter of claim 10, further comprising:
an upconverter configured to process the digital weighted signals to produce the radio frequency signals.

13. The transmitter of claim 10, wherein the transmit weights are derived based on a channel transfer function between the transmitter and an intended receiving device.

14. The transmitter of claim 13, wherein the baseband signal comprises information packets and the bias circuits adjust the bias signals on a per-packet basis to account for changes in the transmit weights that are the result of changing channel conditions between the transmitter and the intended receiving device.

* * * * *